United States Patent
Yeh

(10) Patent No.: US 6,488,154 B1
(45) Date of Patent: Dec. 3, 2002

(54) CHIP TRAY

(76) Inventor: Ming-Chuan Yeh, No. 5, Hsin Le Rd., An Ping Industrial Dist., Tainan (TW)

( * ) Notice: Subject to any disclaimer, the term of this patent is extended or adjusted under 35 U.S.C. 154(b) by 0 days.

(21) Appl. No.: 09/688,896

(22) Filed: Oct. 16, 2000

(51) Int. Cl.⁷ .............................................. B65D 73/02
(52) U.S. Cl. ...................................... 206/725; 206/503
(58) Field of Search ........................ 206/459.1, 459.5, 206/503, 564, 725

(56) References Cited

U.S. PATENT DOCUMENTS

| | | | | |
|---|---|---|---|---|
| 3,494,459 A | * | 2/1970 | Wallestad | |
| 5,310,076 A | * | 5/1994 | Burton et al. | 220/377 |
| 5,957,293 A | * | 9/1999 | Pakeriasamy | 206/725 |
| 6,036,023 A | * | 3/2000 | Pfahnl et al. | 206/714 |
| 6,079,565 A | * | 7/2000 | Walsh et al. | 206/725 |
| 6,152,683 A | * | 11/2000 | Linder | 414/788.2 |

* cited by examiner

Primary Examiner—David T. Fidei
(74) Attorney, Agent, or Firm—Jackson Walker L.L.P.

(57) ABSTRACT

A chip tray has a rectangular base and a protruded area integrally formed on a top face of the base. The base has a concave area defined in a bottom face of the base, a truncated corner defined to facilitate the alignment with another one and at least one cutout defined in an edge of the base. When multiple chip trays are stacked together with the assistance of the truncated corner and the concave area, the cutouts of multiple chip trays form a slot and thus mistakes such as wrong size or wrong feature of the chips are able to be identified easily.

1 Claim, 8 Drawing Sheets

CHIP TRAY

BACKGROUND OF THE INVENTION

1. Field of the Invention

The present invention relates to a chip tray, and more particularly to a chip tray enabling a user to readily identify the serial number and size of the chips received in the tray so as to reduce the risk of having different sizes of chips mixed together.

2. Description of Related Art

Currently, in chip fabricating plants and the chip packaging plants, chips, after being cut, are placed and received in a chip tray to facilitate shipment. Normally, chips of same sizes are received in the same tray with a serial number marking the features of the chips in the tray. FIGS. 7 and 8 show a conventional chip tray comprising a base (70) and multiple compartments (81) defined in a top face of the base (70). On an edge of the top face of the base (70), a series of serial numbers is marked for the user to identify the features of chips (not shown) respectively received in each of the compartments (81). The base (70) has a truncated corner (71) such that multiple trays of this kind are able to be stacked one after another. However, when multiple trays of this kind are stacked together, only the top one is able to be identified by the user. That is, if there is a tray of one size or feature misplaced with another size or feature, the user may not be able to find out this mistake, unless each of the trays is removed from on top of another tray. Therefore, this kind of conventional chip tray is not convenient for the user.

To overcome the shortcomings, the present invention tends to provide an improved chip tray to mitigate and obviate the aforementioned problems.

SUMMARY OF THE INVENTION

The main objective of the invention is to provide a chip tray with which the user is able to identify whether each of the stacked trays are of the same serial number or of the same feature.

Other objects, advantages and novel features of the invention will become more apparent from the following detailed description when taken in conjunction with the accompanying drawings.

DETAILED DESCRIPTION OF PREFERRED EMBODIMENT

Figure 1:
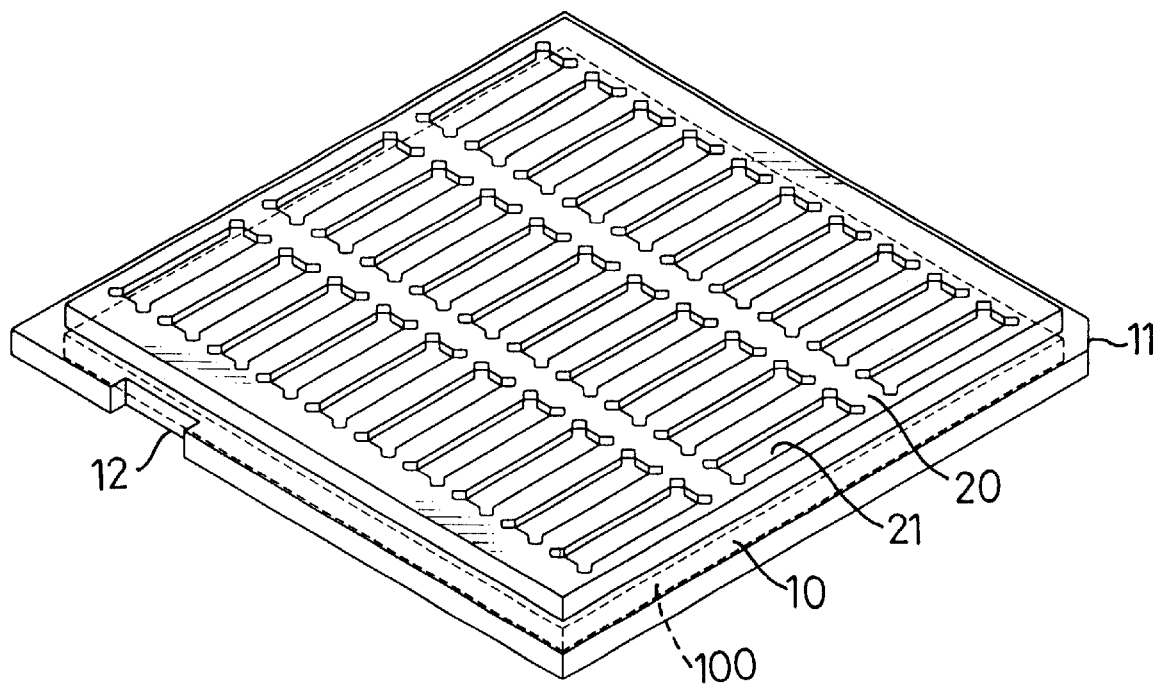
FIG. 1 is a perspective view of the chip tray in accordance with the present invention.

With reference to FIG. 1, a chip tray in accordance with the present invention has a rectangular base (10) with a protruded area (20) integrally formed on a top face of the base (10) and a concave area (100) defined in a bottom face of the base (10) to correspond to the protruded area (20). The base (10) has a truncated corner (11) formed to facilitate the alignment with another chip tray of the invention and at least one cutout (12) defined in an edge. The protruded area (20) defines multiple compartments (21) to receive therein chips of the same feature.

Figure 2:
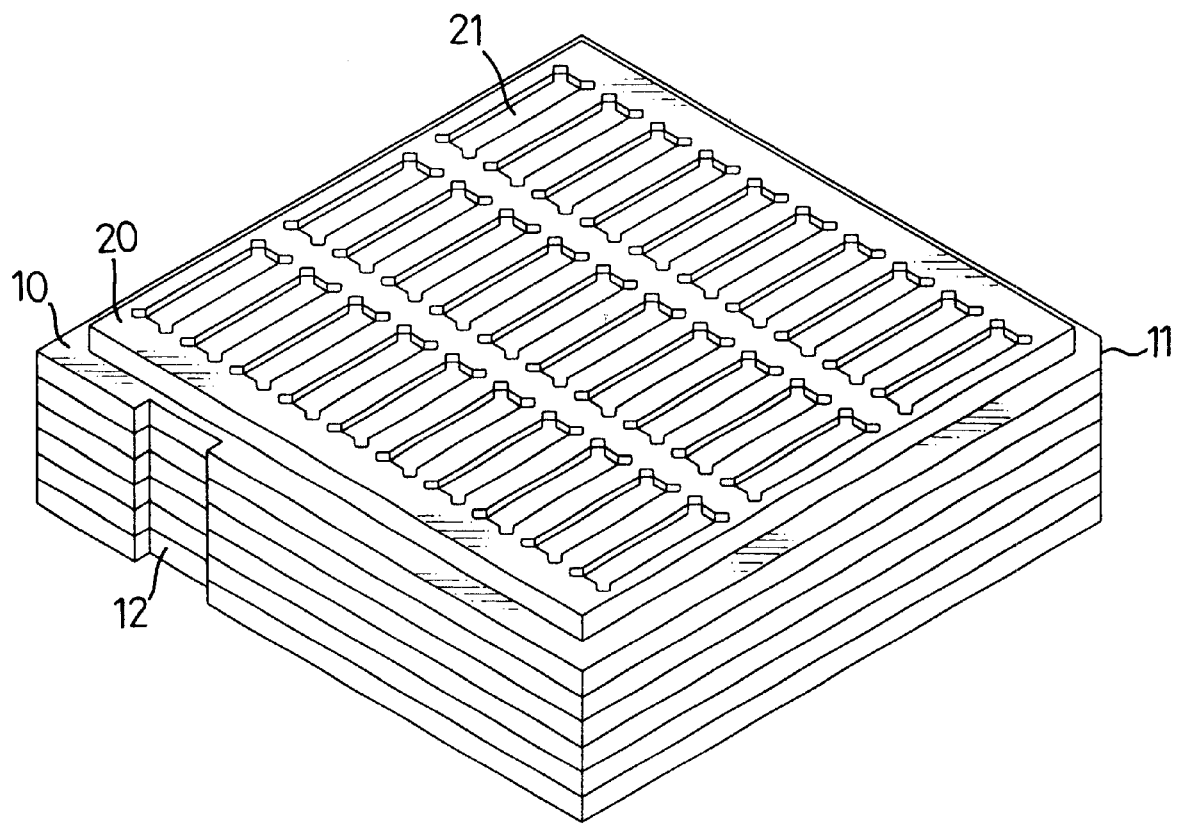
FIG. 2 is a perspective view of multiple chip trays of FIG. 1 stacked together.
Figure 3:
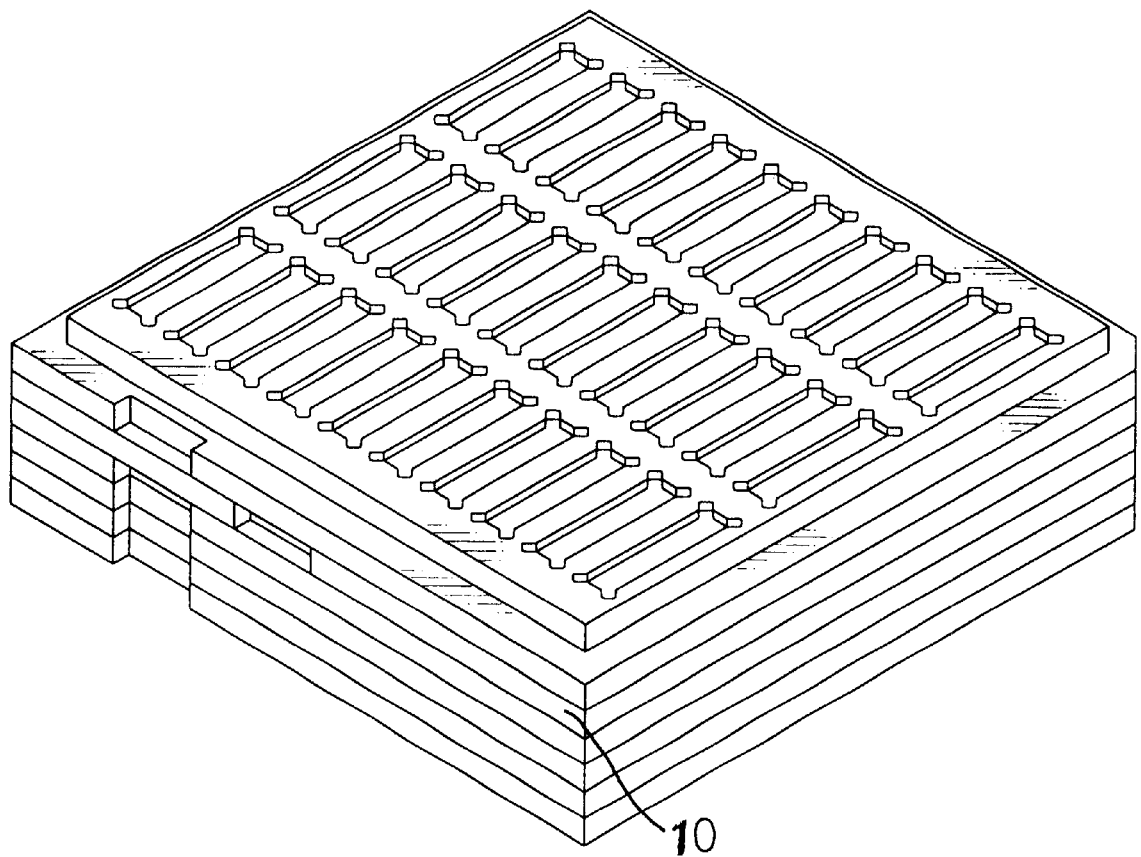
FIG. 3 is an embodiment showing a chip tray with a different feature is easily identified among a stack of chip trays of the same feature.

With reference to FIG. 2, when multiple chip trays of the invention are stacked together, with the alignment of the truncated corner (11) of each of the chip trays, the cutouts (12) of each of the chip trays communicate with one another and thus form a slot. With the alignment of each of the cutouts (12) of the chip trays, should there be any chip tray of another feature placed in a stack of chip trays of a common feature, as shown in FIG. 3, the user is able to find out the mistake and retrieve the wrong tray immediately.

Figure 4:
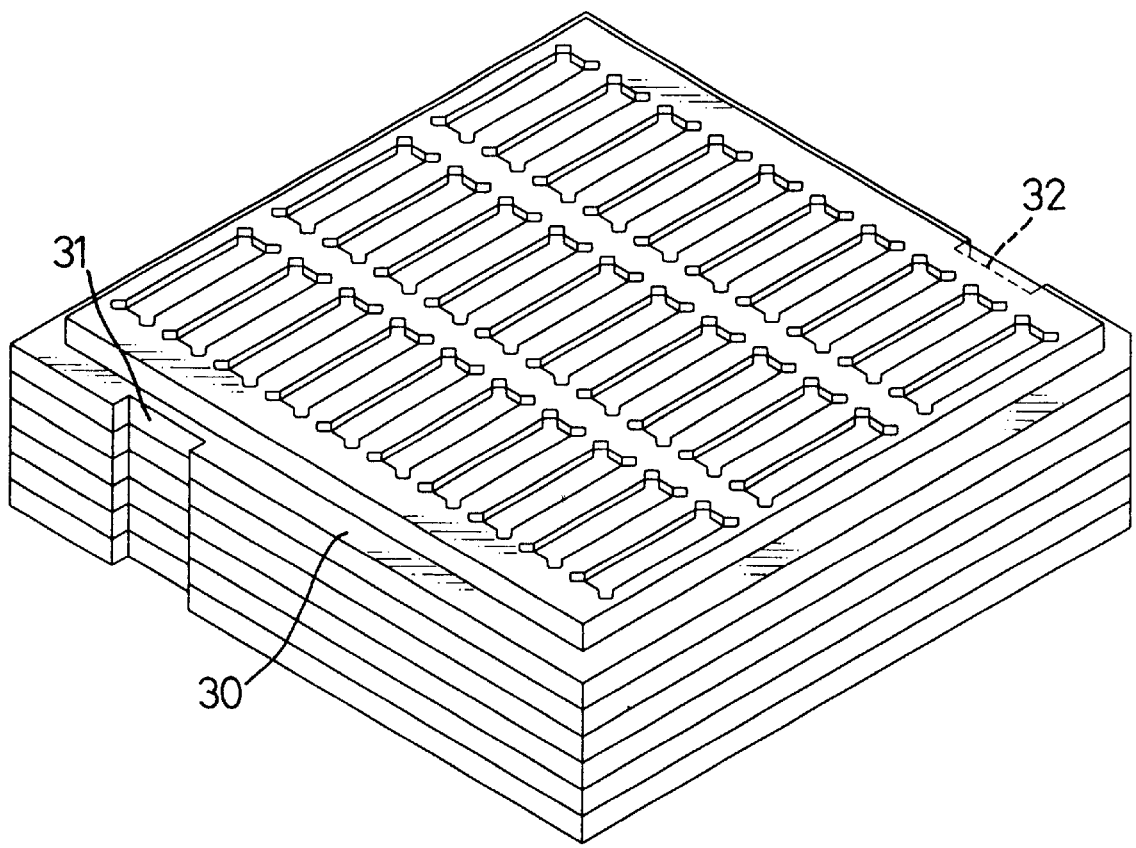
FIG. 4 is a first preferred embodiment of the chip tray of the invention.
Figure 5:
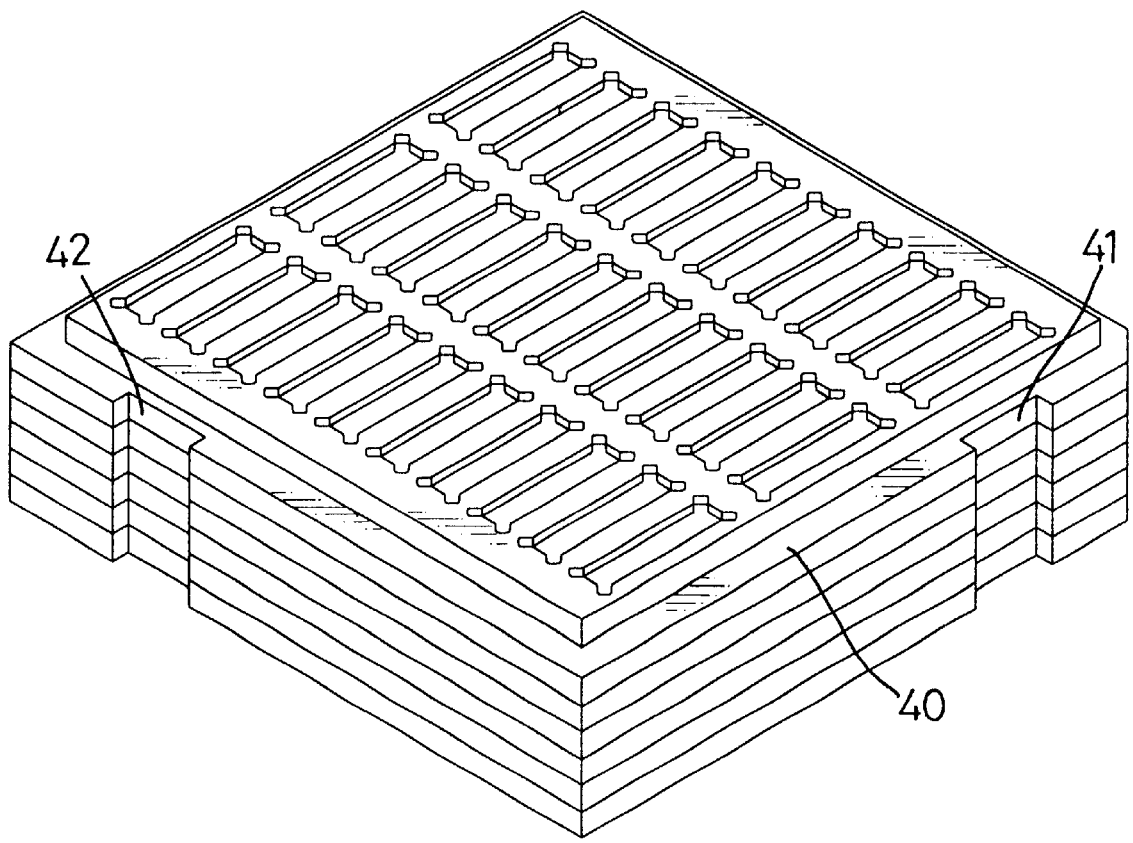
FIG. 5 is a second preferred embodiment of the chip tray of the invention.

With reference to FIG. 4, the chip tray in accordance with the present invention has a first cutout (31) defined in an edge of a base (30) and a second cutout (32) defined in an edge opposed to that of the first cutout (31). With reference to FIG. 5, the chip tray in accordance with the present invention has a first cutout (41) defined in an edge of a base (40) and a second cutout (42) defined in an edge adjacent to that of the first cutout (41). It is noted that from the three embodiments as described in FIGS. 2, 4 and 5, the number and location of the cutout can be used as an identification tool to the size or the feature of the chips received in the chip tray of the invention.

Figure 6:
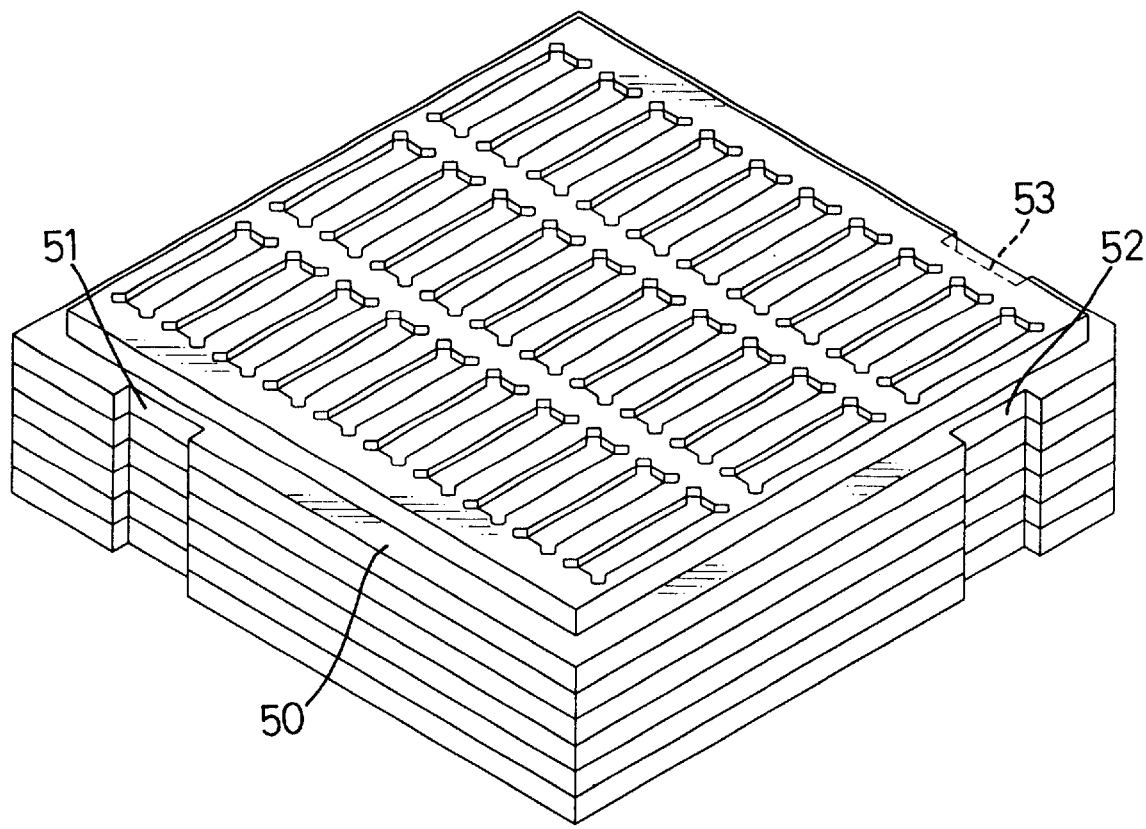
FIG. 6 is still another preferred embodiment of the chip tray of the invention.
Figure 7:
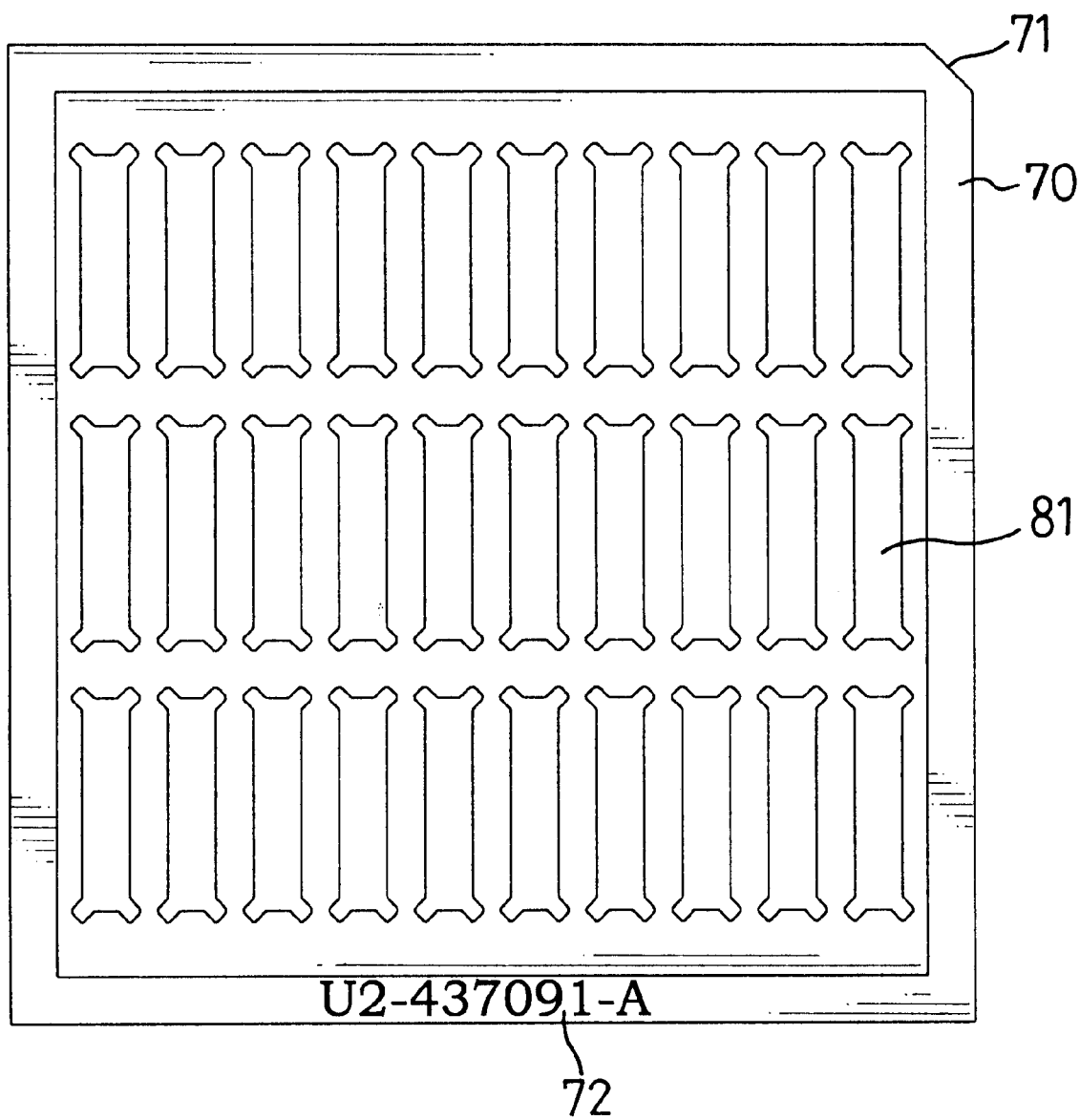
FIG. 7 is a top plan view of a conventional chip tray.
Figure 8:
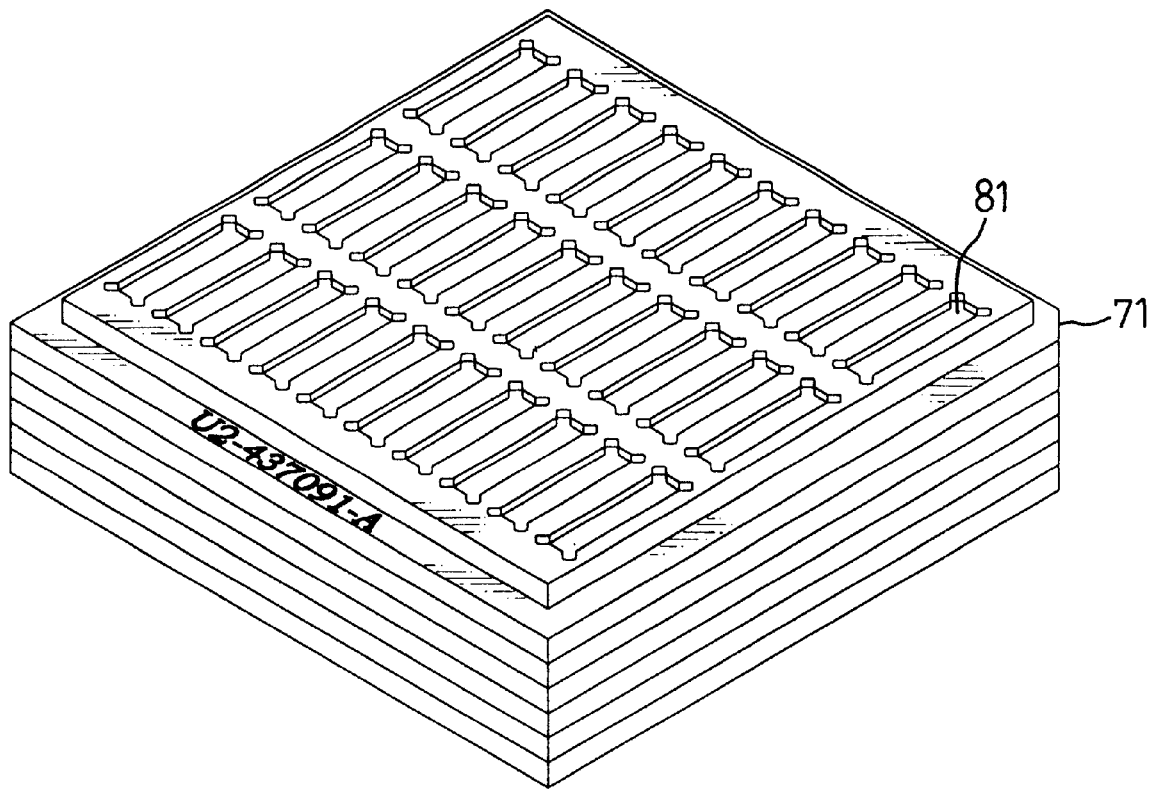
FIG. 8 is a perspective view showing multiple conventional chip trays of FIG. 7 are stacked together.

With reference to FIG. 6, the chip tray may have a first, a second and a third cutouts (51,52,53) defined in three edges. Therefore, with the different combinations of the number and location of the cutout, different sizes and features of chips are able to be identified easily. Thus, even in a large warehouse, workers are able to easily to identify and locate the specific size and model of a specific chip by the number and the location of the cutouts.

It is to be understood, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A chip tray comprising:
    a base having a protruded area integrally formed on a top face of the base, a concave area defined in a bottom face of the base to correspond to the protruded area, a truncated corner formed for facilitating the alignment and three cutouts defined in opposed edges of the base, each cutout defined in three edges of the base;
    wherein the protruded area defines multiple compartments adapted to receive therein chips of the same feature,
    whereby when a plurality of similarly constructed chip trays are stacked, the truncated corner of each of the chip trays is able to facilitate the alignment of the chip trays,
    said cutout communicates with cutouts of each chip tray so as to define a path to function as a marking to distinguish chip features in the compartments.

* * * * *